US010892237B2

(12) United States Patent
Arthur et al.

(10) Patent No.: US 10,892,237 B2
(45) Date of Patent: Jan. 12, 2021

(54) METHODS OF FABRICATING HIGH VOLTAGE SEMICONDUCTOR DEVICES HAVING IMPROVED ELECTRIC FIELD SUPPRESSION

(71) Applicant: General Electric Company, Schenectady, NY (US)

(72) Inventors: Stephen Daley Arthur, Glenville, NY (US); Liangchun Yu, Schenectady, NY (US); Nancy Cecelia Stoffel, Schenectady, NY (US); David Richard Esler, Gloversville, NY (US); Christopher James Kapusta, Delanson, NY (US)

(73) Assignee: General Electric Company, Schenectady, NY (US)

( * ) Notice: Subject to any disclaimer, the term of this patent is extended or adjusted under 35 U.S.C. 154(b) by 70 days.

(21) Appl. No.: 16/221,033

(22) Filed: Dec. 14, 2018

(65) Prior Publication Data

US 2020/0194388 A1 Jun. 18, 2020

(51) Int. Cl.

| | |
|---|---|
| ***H01L 21/00*** | (2006.01) |
| ***H01L 23/60*** | (2006.01) |
| ***H01L 29/16*** | (2006.01) |
| ***H01L 29/66*** | (2006.01) |
| ***H01L 23/00*** | (2006.01) |
| ***H01L 29/10*** | (2006.01) |

(Continued)

(52) U.S. Cl.
CPC .............. *H01L 23/60* (2013.01); *H01L 24/06* (2013.01); *H01L 24/83* (2013.01); *H01L 29/1095* (2013.01); *H01L 29/1608* (2013.01); *H01L 29/2003* (2013.01); *H01L 29/66068* (2013.01); *H01L 29/7783* (2013.01)

(58) Field of Classification Search
CPC ......... H01L 23/60; H01L 24/06; H01L 24/83; H01L 29/1095; H01L 29/1608; H01L 29/2003; H01L 29/66068; H01L 29/7783
USPC ........................................ 438/14, 15, 17, 57
See application file for complete search history.

(56) References Cited

U.S. PATENT DOCUMENTS

| | | | |
|---|---|---|---|
| 6,410,356 | B1 | 6/2002 | Wojnarowski et al. |
| 6,573,534 | B1 | 6/2003 | Kumar et al. |
| 8,318,562 | B2 | 11/2012 | Khan et al. |

(Continued)

FOREIGN PATENT DOCUMENTS

| | | |
|---|---|---|
| CN | 108562813 A | 9/2018 |
| KR | 101439281 B1 | 9/2014 |

OTHER PUBLICATIONS

Neudeck et al., "2000 V 6H-SiC p-n junction diodes grown by chemical vapor deposition", Applied Physics Letters, vol. 64, Issue: 11, 1994.

(Continued)

*Primary Examiner* — Brook Kebede
(74) *Attorney, Agent, or Firm* — Fitch, Even, Tabin & Flannery LLP

(57) ABSTRACT

Methods of fabricating a semiconductor device are provided. The method includes providing a plurality of semiconductor devices. The method further includes disposing a dielectric dry film on the plurality of semiconductor devices, wherein the dielectric dry film is patterned such that openings in the patterned dielectric dry film are aligned with conductive pads of each of the plurality of semiconductor devices.

13 Claims, 7 Drawing Sheets

(51) Int. Cl.
*H01L 29/20* (2006.01)
*H01L 29/778* (2006.01)

(56) References Cited

U.S. PATENT DOCUMENTS

| | | | | |
|---|---|---|---|---|
| 8,680,538 | B2 | 3/2014 | Tarui et al. | |
| 9,337,163 | B2 | 5/2016 | Delgado et al. | |
| 9,343,383 | B2 | 5/2016 | Mieczkowski | |
| 9,741,797 | B2 | 8/2017 | Kagawa et al. | |
| 2007/0007983 | A1* | 1/2007 | Salmon .............. | G01R 31/2886 324/750.08 |
| 2007/0109009 | A1 | 5/2007 | Whetsel | |
| 2008/0241995 | A1 | 10/2008 | Fukui et al. | |
| 2008/0286968 | A1 | 11/2008 | Carta et al. | |
| 2011/0079792 | A1 | 4/2011 | Lostetter et al. | |

OTHER PUBLICATIONS

Isoird et al., “Study of 6H—SiC high voltage bipolar diodes under reverse biases”, Applied Surface Science, pp. 477-482, vol. 184, Issue: 1-4, Dec. 12, 2001.

Losee, P.A., et al.; “SiC MOSFET design considerations for reliable high voltage operation”, 2017 IEEE International Reliability Physics Symposium (IRPS), Monterey, CA, pp. 2A-2.1-2A-2.8, Apr. 2-6, 2017.

International Search Report and Written Opinion; PCT/US2019/065957 dated Apr. 8, 2020.

* cited by examiner

METHODS OF FABRICATING HIGH VOLTAGE SEMICONDUCTOR DEVICES HAVING IMPROVED ELECTRIC FIELD SUPPRESSION

BACKGROUND

The subject matter disclosed herein relates to semiconductor devices, and more particularly, to semiconductor devices having improved electric field suppression.

Power electronic systems, such as power conversion systems, are widely used throughout modern electrical systems to convert electrical power from one form to another form for consumption by a load. Many power electronics systems utilize various semiconductor devices and components, such as thyristors, diodes, and various types of transistors (e.g., metal-oxide-semiconductor field-effect transistors (MOSFETs), junction gate field-effect transistor (JFETs), insulated gate bipolar transistors (IGBTs), and other suitable transistors, in this power conversion process. Various semiconductor devices may be included in power electronic systems to control the flow of current in a circuit. In particular, a semiconductor device, such as transistor (e.g., a metal-oxide-semiconductor field-effect transistor (MOSFET) or Insulated Gate Bipolar Transistors (IGBTs)) may be utilized. However, while particular types of transistors, or other semiconductor devices, may be utilized in high power applications due to certain benefits provided by selection of such transistors, each type of transistor may present a number of design considerations and challenges to ensure reliable operation.

One often-used semiconductor device in power electronic systems is a silcon carbide metal-oxide-semiconductor field-effect transistor (SiC MOSFET). The potential performance benefits of SiC MOSFETs in high power, high frequency power switching applications have been well established. For instance, SiC allows for a high critical electric field strength (2-3 MV/cm) that is approximately 10× higher than that achievable using semiconductor devices (e.g., transistors) fabricated on silicon (Si) substrates. Thus, utilization of SiC substrates provide for devices having high-voltage, high-frequency and high-efficiency performance, since SiC unipolar devices (JFETs, MOSFETs) offer low losses in voltage classes where Si unipolar devices cannot. However, the high electric field associated with SiC materials under blocking conditions (and the interaction of the electric field with dielectric systems above the SiC surface) complicates design, fabrication and testing of SiC MOSFET devices.

In particular, the use of SiC as the material for high voltage power devices presents challenges during fabrication and high voltage testing in both wafer-form and die-form in power modules. In both wafer-form and die-form, the high voltage termination region is typically covered with materials of low dielectric strength, such as air when the device is in wafer form, and silicone gel when the device in module form. When the devices are tested under certain conditions, such as high voltage reverse bias conditions, electric fields extend out of the semiconductor substrate and through the insulating layers that are fabricated as the passivation layers over the termination region. The electric field strengths can exceed the capabilities of the materials over the passivation, posing reliability risks or dielectric failure (arcing).

Embodiments described herein may address one or more of the challenges set forth above.

BRIEF DESCRIPTION

In one embodiment, a method of fabricating a semiconductor device is described. The method includes providing a plurality of semiconductor devices. The method further includes disposing a dielectric dry film on the plurality of semiconductor devices, wherein the dielectric dry film is patterned such that openings in the patterned dielectric dry film are aligned with conductive pads of each of the plurality of semiconductor devices.

In another embodiment, a method of fabricating a semiconductor device is described. The method includes providing a wafer comprising a plurality of semiconductor devices. The method further includes disposing an electric field (E-field) suppression layer on the wafer, wherein the E-field suppression layer comprises openings that are aligned with conductive pads of each of the plurality of semiconductor devices. The method further includes functionally testing each of the plurality of semiconductor devices on the wafer over a full range of operating parameters.

In another embodiment, a method of fabricating a semiconductor device is described. The method includes providing a wafer comprising an electric field (E-field) suppression layer formed over a plurality of semiconductor devices, wherein the E-field suppression layer comprises openings that are aligned with conductive pads of each of the plurality of semiconductor devices. The method further includes functionally testing each of the plurality of semiconductor devices on the wafer, via the conductive pads, over a full range of operating parameters to identify known good die. The method also includes singulating each of the plurality of semiconductor devices. Still further, the method includes packaging the known good die.

BRIEF DESCRIPTION OF THE DRAWINGS

These and other features, aspects, and advantages of the present invention will become better understood when the following detailed description is read with reference to the accompanying drawings in which like characters represent like parts throughout the drawings, wherein.

DETAILED DESCRIPTION

Figure 1:
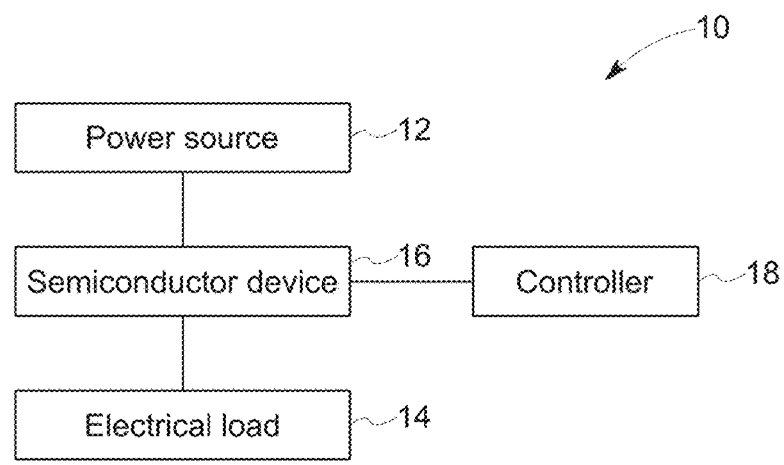
FIG. 1 is a block diagram of a power electronics system including a semiconductor device, in accordance with an embodiment of the present disclosure.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Unless defined otherwise, technical and scientific terms used herein have the same meaning as is commonly understood by one of ordinary skill in the art to which this disclosure belongs. The terms "first," "second," and the like, as used herein do not denote any order, quantity, or importance, but rather are used to distinguish one element from another. Also, when introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. If ranges are disclosed, the endpoints of all ranges directed to the same component or property are inclusive and independently combinable. The modifier "approximately" used in connection with a quantity is inclusive of the stated value and has the meaning dictated by the context (e.g., includes the degree of process variations or errors associated with measurement of the particular quantity).

As used herein, the term "layer" refers to a material disposed on at least a portion of an underlying surface in a continuous or discontinuous manner. Further, the term "layer" does not necessarily mean a uniform thickness of the disposed material, and the disposed material may have a uniform or a variable thickness unless otherwise specified. Furthermore, the term "a layer" as used herein refers to a single layer or a plurality of layers, unless the context clearly dictates otherwise. Further, as used herein, the phrases "disposed on," "sputtered on," or "deposited on" refer to layers disposed directly in contact with each other or indirectly by having intervening layers there between, unless otherwise specifically indicated. The term "adjacent" as used herein means that the two layers are disposed contiguously and are in direct contact with each other. Further, the term "on" describes the relative position of the layers/regions to each other and does not necessarily mean "on top of" since the relative position above or below depends upon the orientation of the device to the viewer. Moreover, the use of "top," "bottom," "above," "below," "upper", and variations of these terms is made for convenience, and does not require any particular orientation of the components unless otherwise stated. With this in mind, as used herein, the terms "lower," "middle," or "bottom" refer to a feature that is relatively nearer the substrate layer, while the terms "top" or "upper" refer to the particular feature that is relatively the farthest from the substrate layer.

Various semiconductor devices may be included in power conversion systems. In particular, a semiconductor device, such as transistor (e.g., metal-oxide-semiconductor field-effect transistor (MOSFET), junction field-effect transistor (JFET) or insulated gate bipolar transistor (IGBT)), and power diodes may be utilized. It should be appreciated that while the present embodiments are described herein in the context of metal-oxide-semiconductor field-effect transistors (MOSFETS), some of the present techniques may be applicable to other types of semiconductor device structures, such as other types of transistors or other semiconductor devices utilized in high voltage systems. Further, while the presently described embodiments have been tested to provide particular benefits to silicon carbide based semiconductor devices (e.g., SiC MOSFETS), the present embodiments may also provide benefits to semiconductor devices that employ other substrate materials, such as silicon (Si), silicon carbide (SiC), germanium (Ge), aluminum nitride (AlN), gallium nitride (GaN), gallium arsenide (GaAs), diamond (C), for example.

Technical effects of embodiments of the present invention provide robust semiconductor devices that may be utilized in high voltage systems and which are testable to full voltage and rated temperatures in wafer form without special probing techniques for arc suppression (e.g. probing using removable liquid dielectric layers or the use of high pressure probing chambers) and testable to full voltage and rated temperatures in die form. Present embodiments provide for semiconductor devices, such as SiC MOSFET devices, having certain regions, such as termination regions, covered with a robust, compliant, thick dielectric, electric field (E-field) suppression layer that is compatible with commercial fabrication and is sufficient to reduce the fringing field strengths below that needed for reliable module use (where the device is encapsulated in silicone gel) or below the dielectric strength of air to avoid arcing when probed in wafer form or in die form, even at rated temperatures.

More specifically, an E-field suppression layer may be patterned and disposed over the device termination region to avoid any arcing under high voltage testing, such as reversed bias at full voltage, and rated high temperatures. In one embodiment, the E-field suppression layer is a dielectric polyimide which may be provided and patterned in roll or sheet form. Metal contact areas on the upper surface of the SiC MOSFET remain exposed through the patterned thick E-field suppression layer for wire bonding or other contact schemes. The E-field suppression layer can be singulated with the die during wafer sawing and remain part of the unpackaged die for discrete packaging or use in power modules where the E-field suppression layer provides protection from reliability failures associated with high electric fields. The E-field suppression layer has a thickness sufficient to suppress or contain electric field arcing that may occur above the surface of the SiC MOSFET during high voltage testing.

Technical effects of the present embodiments allow for testing of the semiconductor devices at full-rated voltage and temperature without the use of special testing equipment and with reduced risk of damage to the semiconductor device or test equipment. Confidence in the yield of "known good die" from wafer probe is enhanced and reliability risks are reduced. Quality issues from insufficient dielectric strength (i.e. air gaps over the termination due to fill issues or bubbles) can be determined at the wafer-level, before the die is assembled into a high value assembly, thereby reducing cost associated with scrapping devices after assembly.

Further, the disclosed embodiments mitigate failures that may be associated with defects that may only be detectable via visual inspection, but where visual inspection during device fabrication is difficult or not possible. For instance, at certain points during manufacture of the semiconductor device there may be no ability to visually inspect for quality defects in or through the clear gel or assembly utilized to manufacture the device. Such visual inspection would typically be desirable to locate debris due to soldering or welding operations associated with fabrication of the semiconductor device (e.g., SiC MOSFET) or to identify other undesirable particles that may impact device operation or reliability. The inability to perform a visual inspection at certain points may be due to a lack of visual capability (no line of sight) to see die in assembly or because there may be no non-destructive test methods to inspect through the surrounding material (e.g., gel). Advantageously, the presently described semiconductor device having a thick E-field suppression layer over the termination region will mitigate failures that may have been associated with air bubbles or particles in previous designs, thereby eliminating the need for visual inspection that may have been beneficial in previous designs, to prevent device failure. Thus, the present embodiments provide for a die-level full voltage rating which provides a higher quality and reliable part. Further in module construction the E-field in the gel can stay below the materials rated dielectric strength ratings avoiding reliability concerns that may be associated with particles and air bubbles.

Still further, in accordance with embodiments provided herein, Power Overlay (POL) structures may be advantageously employed for bonding to SiC MOSFETs. As the current density of the device rises, the device's total current may be limited by the ampacity of the wire connection to the source bond (e.g. limited cross sectional area). This is especially true for smaller die with relatively large areas of the die used for termination. As provided herein, the E-field suppression layer formed over the termination region may be utilized as a POL dielectric layer in conjunction with a POL metallization layer to form a POL structure that redistributes the bonding area to be larger than the original pad size. The disclosed POL structure, incorporating the E-field suppression layer disposed over the termination region, can also provide a re-metallization to be compatible with various metal types and various bonding techniques.

As a further technical effect in accordance with the presently described embodiments, because the die termination region of the semiconductor device typically produces the highest field in the design, implementation of the E-field suppression layer at the termination region may lessen the electrical requirements in subsequent device encapsulation, broadening the material properties allowed. This may allow for higher voltage die to be integrated with lower voltage module design features. Also, the E-field suppression layer provides stress buffering that might have otherwise damaged the device had such a layer not been provided, which may allow for the use of rigid encapsulation materials providing for larger volume device sizes or more intricate 3D module shapes.

With the foregoing in mind, FIG. 1 illustrates a block diagram of an embodiment of a power electronics system 10 (e.g., a power conversion system, a switching system, etc.). The power electronics system 10 may include a power source 12, an electrical load 14, at least one semiconductor device 16 (e.g., a switching device), and a controller 18 (e.g., an electronic control unit). The power source 12 may include an alternating current (AC) power source or a direct current (DC) power source. In some embodiments, the power source 12 may include a power grid, an electrical generator, a battery, or the like. The power source 12 may be electrically connected to the semiconductor device 16 and may supply electrical current (e.g., AC current or DC current) to the semiconductor device 16. Additionally, the at least one semiconductor device 16 may be electrically connected to the electrical load 14 and may supply electrical current (e.g., AC current or DC current) to the electrical load 14. The electrical load 14 may include a DC load or an AC load. In certain embodiments, the electrical load 14 may be configured to store the electrical power and/or to use the electrical power to perform an operation. For example, the electrical load 14 may include a battery, a computer, an electric motor, or the like.

The semiconductor device 16 may be communicatively coupled to the controller 18 via one or more wired and/or wireless connections. In some embodiments, the controller 18 may include one or more processors and one or more memory devices (e.g., tangible, non-transitory, computer-readable media) storing instructions executable by the one or more processors. In certain embodiments, the controller 18 may include logic arrays and/or control circuitry. The controller 18 may be configured to switch the semiconductor device 16 between a conducting state (e.g., an on state) and a non-conducting state (e.g., an off state). Further, the semiconductor device 16 may be configured to control the flow of electrical current from the power source 12 to the electrical load 14. In particular, the semiconductor device 16 may allow or enable current to flow from the power source 12 to the electrical load 14 when the semiconductor device 16 is in the conducting state. Additionally, the semiconductor device 16 may block the flow of current from the power source to the electrical load 14 when the semiconductor device 16 is in the non-conducting state. In accordance with one embodiment, the semiconductor device 16 comprises a silicon carbide metal oxide semiconductor field effect transistor (SiC MOSFET) fabricated to include a thick dielectric layer patterned over the termination regions, as summarized above and described in further detail below. In some embodiments, the controller 18 may be configured to control the semiconductor device 16 to convert AC current from the power source 12 into DC current.

Figure 2:
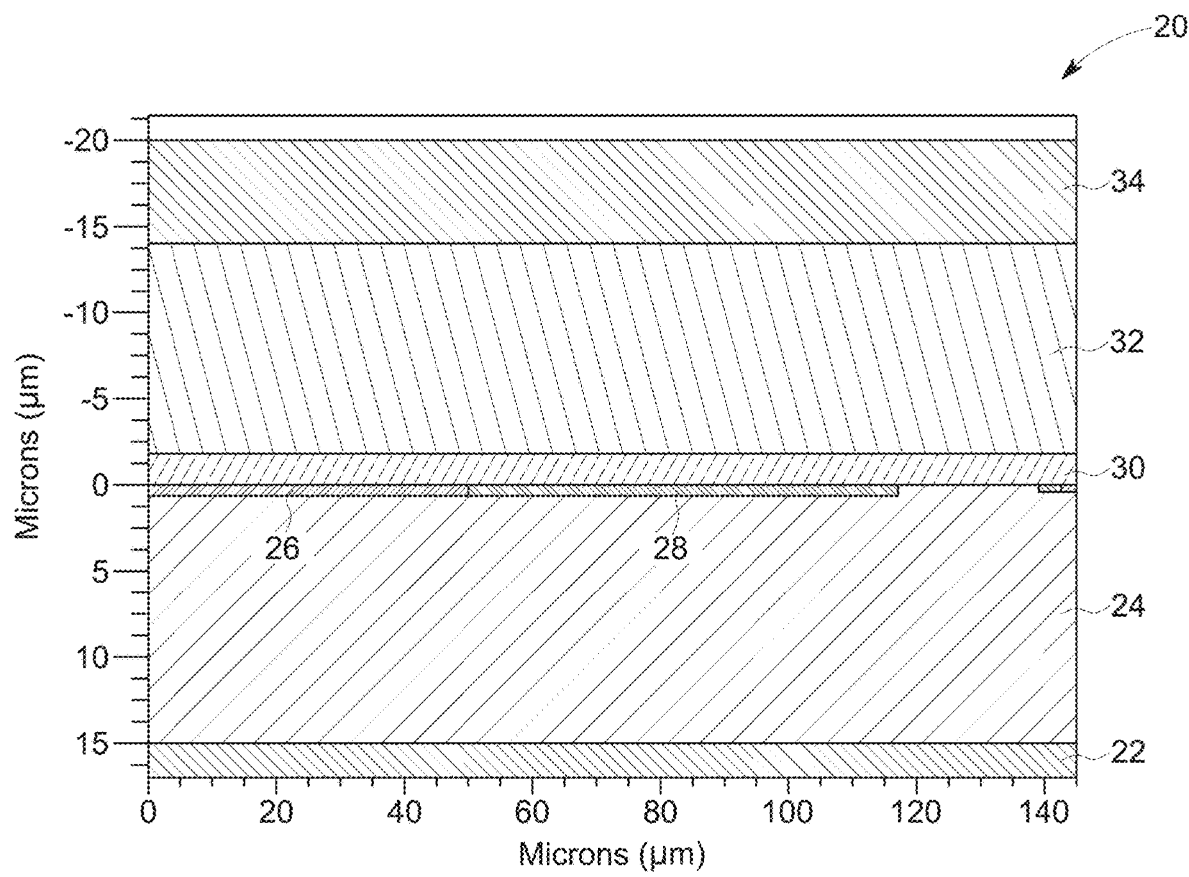
FIG. 2 is a cross-sectional view of the termination region of a silicon carbide (SiC) semiconductor device that may be utilized in a power electronics system.

FIG. 2 is a cross-sectional view of an embodiment of a portion of a semiconductor device 16 that may be used in the power electronics system 10 of FIG. 1. In particular, the semiconductor device 16 illustrated in FIG. 2 is a portion of a planar n-channel silicon carbide metal oxide semiconductor field effect transistor (SiC MOSFET), hereinafter referred to as the SiC MOSFET device 20. As previously described, during operation and testing of the device, the termination region of the SiC MOSFET device 20 may exhibit high electrical field, particularly under certain operating conditions, discussed in detail below. Accordingly, the illustrated SiC MOSFET device 20 is described in conjunction with experimental data and simulation results provided to demonstrate certain reliability issues that have been identified and which may be associated with testing SiC MOSFET devices in wafer form and die form. In particular, only the termination region of the SiC MOSFET device 20 has been illustrated to more clearly describe the experimental/modeling data and the challenges that may be associated with testing SiC MOSFET devices (and other high voltage devices) over the full voltage and temperature ratings.

The illustrated SiC MOSFET device 20 of FIG. 2 includes a semiconductor substrate layer 22, a semiconductor drift layer 24, a blocking junction 26 and a junction termination region 28. In the embodiment described above, the semiconductor substrate layer 22 and the semiconductor drift layer 24 may comprise silicon carbide (SiC). The semiconductor drift layer 24 may be of a first conductivity type (e.g., an n-type drift layer) and may interface directly with (i.e., disposed in direct contact with) the underlying SiC substrate layer 22. In some embodiments, the semiconductor substrate layer 22 may have the first conductivity type and may be more heavily doped than the semiconductor drift layer 24

(e.g., an n+ substrate layer). The blocking junction 26 may be formed in or on an upper portion of the semiconductor drift layer 24 and may be heavily doped with a second conductivity type (e.g., a p+ blocking junction) to provide a PN junction at the interface with the n-type portion of the semiconductor drift layer 24. The junction termination (JTE) region 28 is provided as a termination of the PN junction between the blocking junction 26 and the semiconductor drift layer 24. The JTE region 28 is a region having a graded doping profile relative to the proximity with the blocking junction 26. That is, the JTE region 28 may be doped most heavily with the second conductivity type (e.g., p+) at the interface with the blocking junction 26. As the JTE region 28 extends laterally further from the interface with the blocking junction 26, the JTE region 28 gradually becomes less heavily doped. This graduated doping from heavy to light across the JTE region 28 creates a graded distribution of charge and spreads the electric field across the region.

The JTE region 28 described herein provides an illustrative example of a junction termination, and more specifically, the JTE region 28 described herein depicts an illustrative example of a graded zone JTE. However, in some embodiments, implanted regions having the second conductivity type (e.g., p-type), such as floating regions, may additionally or alternatively be implemented to have one or more properties corresponding to another termination and/or junction termination structure. For instance, implanted regions may be implemented as a single zone JTE, which may include a single implanted region in contact with an intermediate well region, and/or as a multiple zone JTE, which may include two or more connected implanted regions. In some embodiments, the two or more connected implanted regions may have the same or different properties, and at least one of the two or more connected implanted regions may contact the intermediate well region. Additionally, in some embodiments, the implanted regions may be implemented to form a multiple floating zone JTE. In such embodiments, a first implanted region may contact the intermediate well region, while a set of additional implanted regions, such as floating regions, having different spacing and/or widths may be implanted disconnected from the first implanted region and from one another. Further, in some embodiments, the implanted regions (e.g., floating regions) may be implemented to form a floating field ring (FFR) termination. In such embodiments, the floating regions may be implanted disconnected from one another and disconnected from the intermediate well region. Additionally, or alternatively, the implanted regions may be implemented to form a space modulated JTE, which may include a first implanted region in contact with the intermediate well region and disconnected from a set of additional implanted regions implanted to form a FFR. Accordingly, it may be appreciated that techniques described herein may be applied to any suitable junction termination, such as a single zone JTE, a multiple zone JTE, a graded JTE, a multiple floating zone JTE, a FFR, a space modulated JTE, and/or the like, and that embodiments described herein are intended to be illustrative and not limiting.

As used herein, the terms "semiconductor elements," "transistor elements," "active elements," "active device elements," "MOSFET elements," or the like, refer to the layers and materials that make up the portions of the device that are formed on, in, above or around the semiconductor materials. These terms do not include any dielectric materials disposed over the surface of the device. For instance, in the illustrated example, the semiconductor elements (transistor elements, active elements, active device elements) of the SiC MOSFET device 20 include a semiconductor substrate layer 22, a semiconductor drift layer 24, a blocking junction 26 and a junction termination region 28. However, the term is not inclusive of the overlying dielectric or insulative isolation materials further described below.

As will be appreciated, the SiC MOSFET device 20 may also be coated with a number of dielectric films and insulation layers to provide physical and electrical isolation of the underlying device. For instance, the SiC MOSFET device 20 may include a passivation layer 30 and a dielectric layer 32. As described further below, when the SiC MOSFET device 20 is in wafer form or die form before the device is fully packaged, the SiC MOSFET device 20 may be tested in a post-fabrication material or environment 34. That is, element 34 is used herein to designate the testing environment when the SiC MOSFET 20 is still in wafer or die form.

The passivation layer 30 may include one or more thin layers of insulation material, such as oxides and nitrides, that are used to form passivation layers during typical wafer processing. The thin layer or layers that form the passivation layer 30 may be deposited by standard deposition techniques to form a passivation layer 30 having a thickness in the range of approximately 1-10 microns (μm), for instance. In one embodiment of the MOSFET device 20 described in detail below with regard to simulation testing, the passivation layer 30 has a thickness of approximately 1.8 μm. By way of example, TABLE 1 provides a list of glassy films having various film types, dielectric properties and possible thicknesses under standard processing, that may be used alone or in combination with one another (or like-materials) to form the passivation layer 30.

TABLE 1

| Film type | Dielectric constant | Dielectric strength (V/cm) | Range thickness (um) |
|---|---|---|---|
| Thermal SiO2 | 3.9 | 10E6 | <3 |
| LPCVD SiH2Cl2 + N2O SiO2 | 3.9 | 10E6 | <1.5 |
| LPCVD TEO5 + O2 Sio2 | 3.9 | 5-10E6 | <2 |
| LPCVD SiH4 + O2 SiO2 | 4.1 | 8E6 | <2 |
| SACVD TEO5 + O3 SiO2 | 4.3 | 5-10E6 | <10 |
| PECVD TEO5 + O2 SiO2 | 4.1 | 3-6E6 | <4-5 |
| PECCVD SiH4 + N2O SiO2 | 4.1 | 3-6E6 | <4-5 |
| PSG | 4.1-4.3 | 5-7E6 | |
| BPSG | 4.1-4.3 | 5-7E6 | |
| LPCVD Si3N4 | 6-7 | 10E6 | <2 um |
| PECVD SiN*x* | 6-9 | 5E6 | <4 |

As is evident from TABLE 1, while the dielectric strength of the oxide and nitride materials is excellent (e.g., in the range of 3.0E6-10.0E6 V/cm), the thickness of the materials in the passivation layer 30 is generally limited to less than 10 μm using standard deposition techniques. Thus, the passivation layer 30 provides some electrical isolation of the termination region of the SiC MOSFET device 20. However, this electrical isolation may be insufficient to fully isolate the active materials during high voltage operations, as described below.

To provide further electrical isolation of the underlying termination region of the SiC MOSFET device 20, a dielectric layer 32 may be formed over the passivation layer 30. In accordance with standard deposition techniques employed in wafer processing, polyimides (or similar materials) may be deposited alone or in combination with one another to form the dielectric layer 32. By way of example, TABLE 2 provides a list of various polyimides that may be considered for on-wafer termination region coverage and that may be deposited by standard techniques used in wafer processing.

TABLE 2

| Material | Dielectric constant | Dielectric strength (volts/cm) | Thickness Range um |
|---|---|---|---|
| Fujifilm Durimide 7520 | 3.2-3.3 | 3.45E6 | 10-12 um typical |
| Fujifilm LTC 9500 | 3.5-3.6 | >4.50E6 | Up to 7 um listed in datasheet |
| HD 4110 | 3.2 | 2.75E6 | 15 um max |
| HD 8820 | 2.94 | 4.70E6 | 10 um max |
| AsahiKasei AM-270 | 2.9 | 4.70E6 | 2-15 um |

As is evident from TABLE 2, while the dielectric strength of the polyimide materials is good (e.g., in the range of 2.75E6-4.70E6 V/cm), the thickness of the materials in the dielectric layer 32 is generally limited to less than 15 μm using standard deposition techniques. While the dielectric layer 32 may provide further isolation of the termination region of the SiC MOSFET device 20, this layer, in combination with the passivation layer 30, may not be sufficient to fully isolate the device during high voltage operation.

When the SiC MOSFET device 20 has been fabricated but is still in wafer form, the device may be electrically probed at the termination region for reliability and functional testing. That is, it is beneficial to test the SiC MOSFET devices 20 in wafer form before the die are singulated and packaged to identify known good die. The sooner that defects are identified, the less time and material may be wasted by further processing devices that will eventually be scrapped. By testing the SiC MOSFET device 20 in wafer form (and again in die form, before further packaging), known good die can be identified early. Thus, when the SiC MOSFET device 20 is in wafer form, it is typically probed in a post-fabrication material (environment) 34, such as air or gel. Notably, to make the electrical testing optimally meaningful, the SiC MOSFET device 20 should be tested over a full range of possible operating temperatures and electrical limits for which the SiC MOSFET device 20 is rated to perform. However, the electrical probing of the SiC MOSFET device 20 in wafer form may present problems at full power ratings and temperature, based on the high E-fields produced at the terminal regions at high voltages. Consider, for example, that the post-fabrication material 34 may include one of the materials provided in TABLE 3.

TABLE 3

| Material | Dielectric constant | Dielectric strength (volts/cm) | Thickness Range |
|---|---|---|---|
| Silicone gel | 2.7 | 1.75E5 at 25 C. 1.0E5 at 175 C. | >1 mm |
| Molding compound | 3.98 | 3.1E5 at 200 C. | >1 mm |
| Dry Air | 1 | ~3.0E4 | >1 mm |

Notably, the dielectric strength of dry air is the lowest of the post-fabrication materials or test environments 34 at standard temperature and pressure (STP). Thus, in testing the SiC MOSFET device 20 in wafer form, the SiC MOSFET device 20 should be able to be tested to its highest rated voltage operation in dry air, while keeping the E-field strength measurable at a surface of the SiC MOSFET device 20 to a level at or below 3.0E4 V/cm. Test results of the various embodiments of the SiC MOSFET device 20 described above having a glassy film passivation layer 30 having a thickness of less than 10 μm and a polyimide dielectric layer 32 having a thickness of less than 15 μm, have demonstrated that the illustrated design of FIG. 2, with no additional material, is insufficient to provide complete electrical isolation in typical post-fabrication material 34. Specifically, simulation results of the SiC MOSFET device 20 being tested under reverse bias conditions (1700 V) in air suggest that the measurable magnitude of the electric field strength is approximately 2.7E5 V/cm, which is well above the target maximum E-field strength in air at the surface of 3.0E4 V/cm. That is, the described passivation layer 30 in combination with the dielectric layer 32 do not provide the necessary protection to avoid arcing during testing in wafer or die form, without special test equipment, at high temperature rating limits of the MOSFET device 20 (e.g., 175° C.-200° C.) and high voltage rating limits of the MOSFET device 20 (e.g., 1700 V under full reverse bias conditions) in gel or air.

To mitigate the likelihood of arcing above the materials formed over the termination region of the SiC MOSFET device 20 during wafer testing and die testing, but before completed packaging of the SiC MOSFET device 20, an E-field suppression layer (illustrated and described further below with regard to FIGS. 3-7B) is disclosed herein, in accordance with embodiments of the present invention. The E-field suppression layer provides further electrical isolation of the termination region of the SiC MOSFET device 20 such that the device may be reliably tested in wafer and die form, at all rated temperatures and voltages.

In selecting materials to be used for the E-field suppression layer that may be deposited, disposed or generally formed on top of the illustrated dielectric layer 32, certain design considerations were made. Because the materials of the dielectric layer 32 have favorable properties, including high dielectric strength, similar dielectric materials were examined for usage at the E-field suppression layer. Simulations were thus run to model results of a SiC MOSFET device 20 having additional dielectric material over the passivation layer 30 and dielectric layer 32 to determine an appropriate thickness of dielectric material having E-field strengths in the range of 2.0E6-5.0E6 V/cm and dielectric constants in the range of 2.9-3.6 to form an E-field suppression layer to reliably test the SiC MOSFET device 20.

Figure 3:
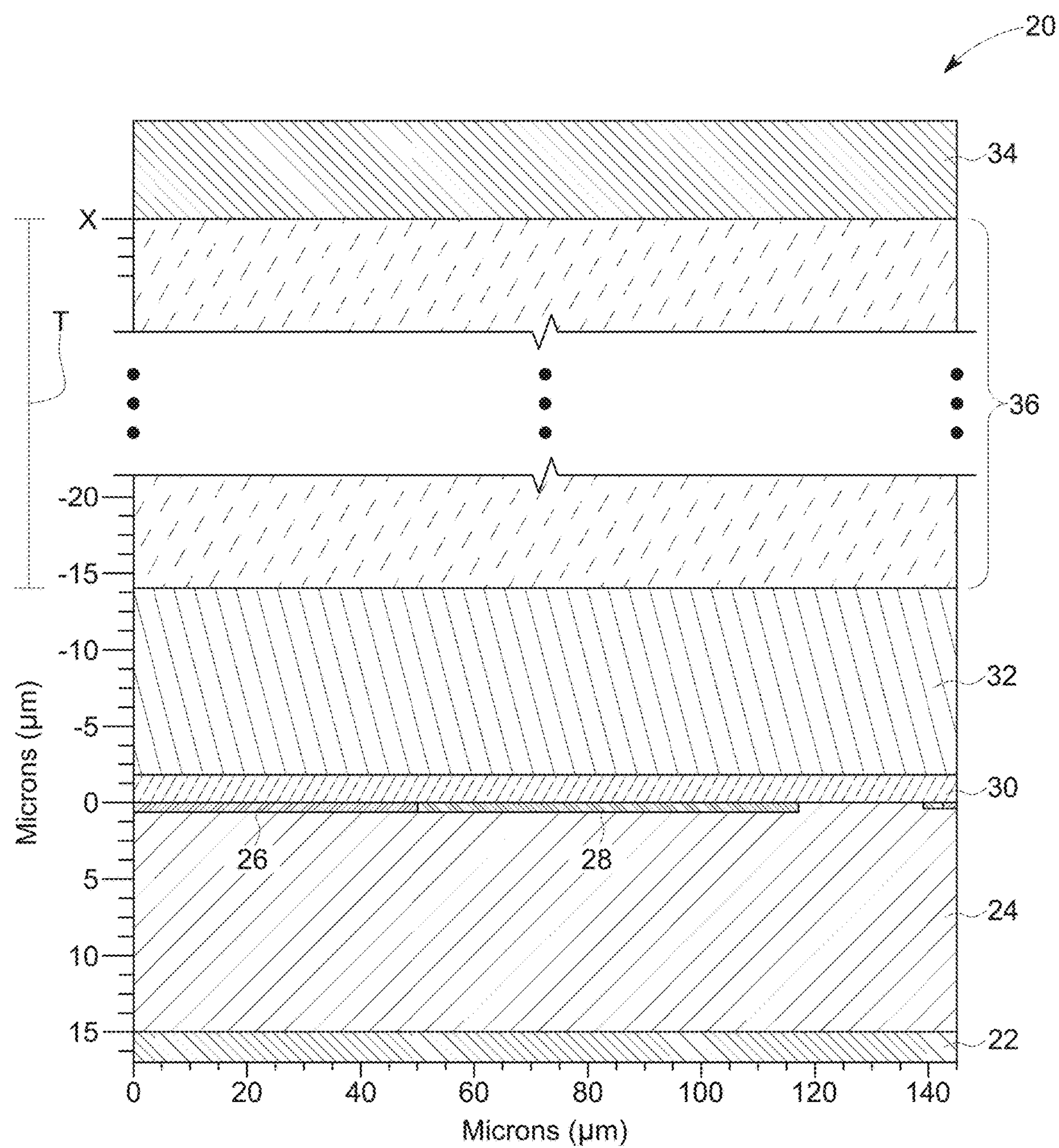
FIG. 3 is a cross-sectional view of the termination region of a silicon carbide (SiC) semiconductor device that may be utilized in a power electronics system, in accordance with an embodiment of the present disclosure.

FIG. 3 illustrates the SiC MOSFET device 20, having an E-field suppression layer 36 formed on the dielectric layer 32. In accordance with embodiments described herein, the E-field suppression layer 36 provides sufficient isolation of the electric fields produced over the termination region of the SiC MOSFET device 20 in wafer form or die form, over full temperature and voltage ratings. As will be described with regard to the simulated test results illustrated in FIG. 4 a sufficient thickness T of the E-field suppression layer 36 when utilizing a material having E-field strengths in the range of 2.0E6-5.0E6 V/cm and dielectric constants in the range of 2.9-3.6 was found to be in the range of approximately 80 μm-100 μm, depending on the thicknesses and materials chosen for the underlying passivation layer 30 and dielectric layer 32. This range of thicknesses T of the E-field suppression layer 36 also provides sufficient electrical isolation in the "worst case" test environment of air. As will be appreciated, the thickness T of the E-field suppression layer 36 may be reduced below the range of approximately 80 μm-100 μm, if the dielectric strength and/or thicknesses of the passivation layer 30 or dielectric layer 32 are increased. In certain embodiments the thickness T may be greater. For instance, in other embodiments, the thickness T may be in the range approximately 50 μm-200 μm However, the selection of these materials and the deposition techniques that are commonly available in typical fabrication facilities may limit material selection and thickness capabilities to materials and thicknesses similar to those described with regard to TABLES 1 and 2. Further, if the test environment (i.e., the post-fabrication material 34) is known to be something other than air (e.g., silicone gel), the thickness of the E-field suppression layer 36 may also be reduced, as described further below with regard to FIG. 4.

As will also be described, based on the simulated test results indicating that a thickness T of the E-field suppression layer 36 be in the range of approximately 80 μm-100 μm, for materials having E-field strengths in the range of 2.0E6-5.0E6 V/cm and dielectric constants in the range of 2.9-3.6, many conventional techniques are not capable of depositing materials, such as those described above in TABLE 2, to the appropriate thickness range. Accordingly, other forms of materials are disclosed herein, as selectable materials for the E-field suppression layer 36. For instance, polyimide, polybenzoxazole (PBO), or a mixture of the two may be utilized as the E-field suppression layer 36. These materials may be applied to the chip surface as a liquid dielectric that is dispensed cured and patterned. The material may be spuncast, dipcoated, spray coated, or screen printed. It is also possible to additively apply the liquid resin material using additive techniques which may include screenprinting, aerosol jet printing, gravure, or syringe dispense. In one embodiment, the thick dielectric utilized for the E-field suppression layer 36 may be provided as dry film in sheet or roll-form of a polyimide (e.g., Kapton brand). While polyimide in sheet form is generally described below as a material candidate for this E-field suppression layer 36 and has been demonstrated for its experimental validation, other high temperature dielectric materials are available in a sheet form. For instance, Polyetherimide (Ultem), Polyimides, polyetherimides, Liquid Crysal Polymer (LCP) polysulfones, polyether ether ketones (PEEK), polyarylene ether ketone, epoxies, and polybenzoxazole and fluoropolymers or epoxy are also available in 100 to 500 um thick sheets and may be considered as well.

Figure 4:
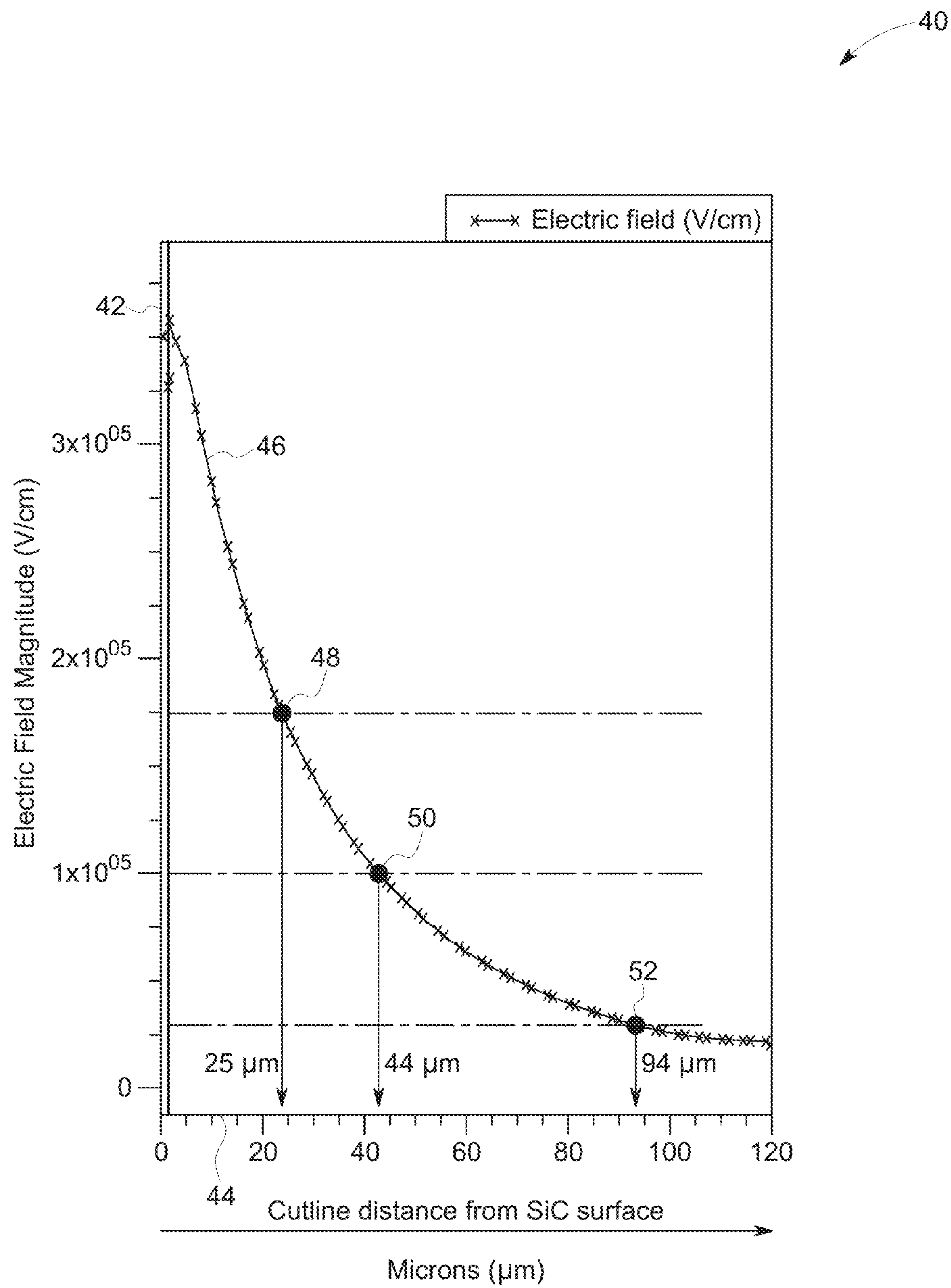
FIG. 4 illustrates modeling results of electric field strength above the surface of the SiC semiconductor device of FIG. 3, through various materials and temperatures.

Referring to FIG. 4, model results 40 are illustrated. Specifically, the SiC MOSFET device 20 was modeled, having a passivation layer 30 and dielectric layer 32 having similar properties to those described above with regard to TABLES 1 and 2 and having an E-field suppression layer (e.g., a polyimide material) 36 formed thereon. The simulated measurements of the E-field strength through the simulated polyimide (along the y-axis 42) were plotted as a function of distance from semiconductor the surface of the SiC MOSFET device 20 (along the x-axis 44) to determine a thickness of the polyimide E-field suppression layer 36 to sufficiently suppress the electric field produced at the most extreme operating conditions (e.g., 1700 V under full reverse bias conditions) in gel or air. That is, selection of the thickness of the polyimide E-field suppression layer 36 can be determined such that the electric field magnitude of E-field suppression layer 36 is greater than or equal to the dielectric strength of the testing environment (i.e., the post-fabrication material 34). Further consideration may be provided if the dielectric strength of the post-fabrication material 34 varies with temperature (such as silicone gel).

Referring again to TABLE 3, if silicone gel is the post-fabrication material 34, the dielectric strength of the silicone gel at room temperature (25° C.) is approximately 1.75E5 V/cm and approximately 1.0E5 V/cm at 175° C. The dielectric strength of air is approximately 3.0E4 over the standard operating range of the SiC MOSFET device 20. Accordingly, the thickness of the E-field suppression layer 36 should be chosen to reliably suppress any E-field that might be produced above the termination region of the SiC MOSFET device 20. Returning again to FIG. 4, simulation test results under these three conditions demonstrate minimum thicknesses of the E-field suppression layer 36 to ensure reliable testing over the full voltage and temperature range of the SiC MOSFET device 20.

Specifically, the curve 46 models the electric field strength through the thickness of the polyimide, and thus provides threshold thicknesses for the E-field suppression layer 36 to provide adequate suppression of the electric field at 1700V. If the post-fabrication material 34 in which the device is to be tested is a silicone gel and the SiC MOSFET device 20 is operating in room temperature, a threshold thickness of approximately 25 μm of the E-field suppression layer will reduce the electrical field magnitude to less than 1.75E5 V/cm, which is sufficient to suppress the maximum E-field that may be produced above the termination region, as indicated by point 48 on the curve 46. If the post-fabrication material 34 is a silicone gel and the MOSFET device 20 is operating in a temperature of 175° C., a threshold thickness of approximately 44 μm of the E-field suppression layer 36 will reduce the electrical field magnitude to less than 1.0E5 V/cm, which is sufficient to suppress the maximum E-field that may be produced above the termination region, as indicated by point 50 on the curve 46. If the post-fabrication material 34 is air and the MOSFET device 20 is operating at any temperature, a threshold thickness of approximately 94 μm of the E-field suppression layer 36 will reduce the electrical field magnitude above this layer to less than 3.0E4 V/cm, which is sufficient to suppress the maximum E-field that may be produced above the termination region, as indicated by point 52 of the curve 46. Thus, to allow for a "worst-case" testing scenario wherein the testing environment (i.e., the post-fabrication material 34) is air, a total dielectric thickness of approximately 94 μm should be selected to mitigate reliability risk and/or dielectric failure (i.e, arcing) during testing at rated voltages and temperatures of the MOSFET device 20. That is, a combined thickness of the passivation layer 30, dielectric layer 32 and E-field suppression layer 36 should be approximately 94 μm (or greater), to ensure reliable testing. Thus, in an embodiment where the thickness of the passivation layer 30 is approximately 1.8 μm, the thickness of the dielectric layer 32 is approximately 12 μm, the thickness of the E-field suppression layer 36 should be greater than or equal approximately 82.2 μm.

Figure 5:
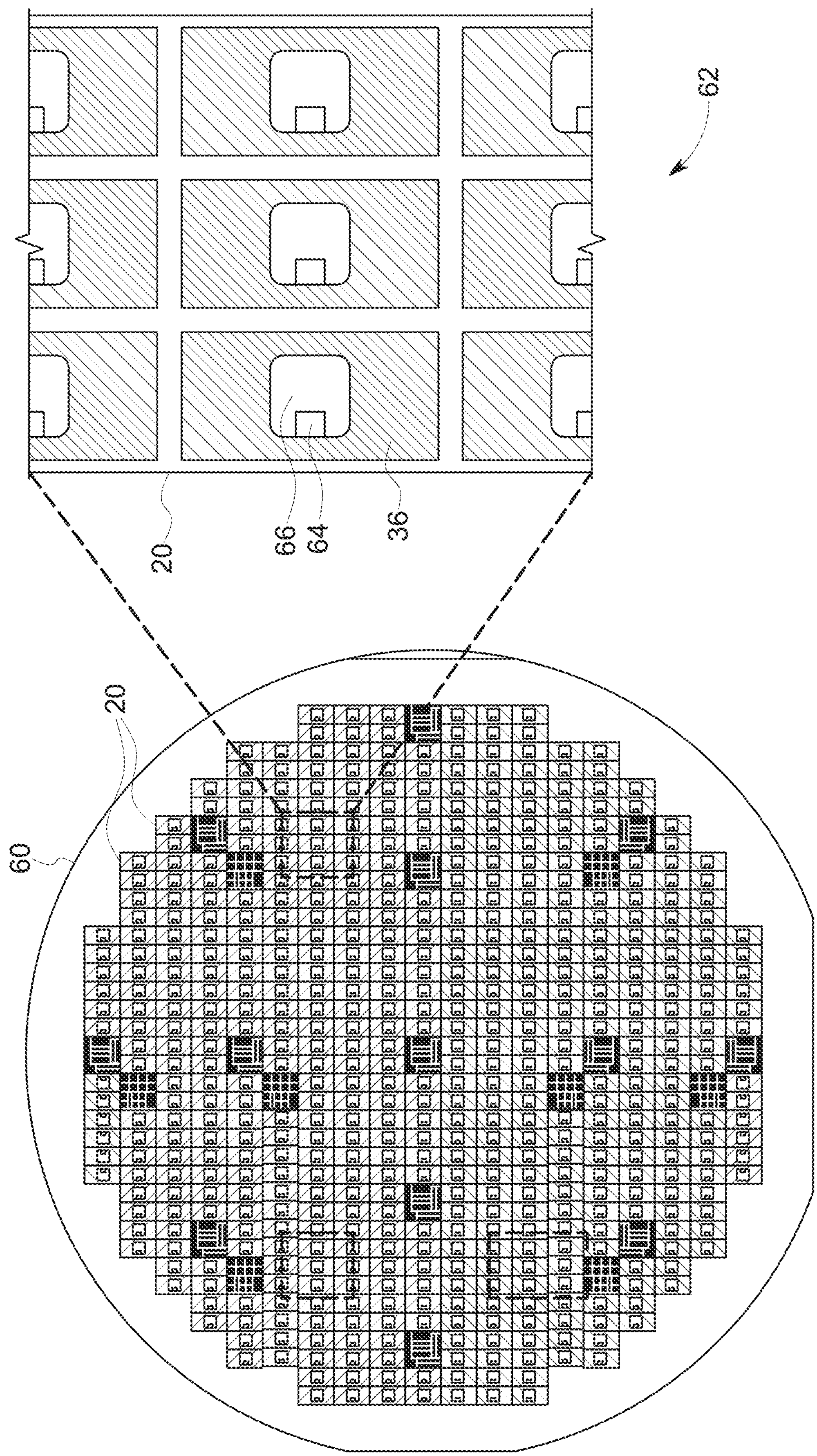
FIG. 5 illustrates a wafer fabricated with an E-field suppression layer, in accordance with an embodiment of the present invention.

FIG. 5 illustrates a test wafer 60 including a number of SiC MOSFET devices 20, fabricated in accordance with the present embodiments and tested to provide experimental validation. An enlarged view of a portion 62 of the wafer 60 is provided to better illustrate the SiC MOSFET die 20. In accordance with the present embodiments, each die includes an E-field suppression layer 36. For testing and validation purposes in wafer form, the passivation layer 30 (not visible) was deposited to a thickness of approximately 1.8 μm. A polyimide Kapton film available in roll form was adhered to the wafer and provides the E-field suppression layer 36. The combined thickness of the E-field suppression layer 36 and underlying dielectric layer 32 was approximately 87 μm. Before the film (E-field suppression layer 36) was aligned and adhered to the wafer, the E-field suppression layer 36 was patterned via laser ablation to expose the gate metal 64 and source pad 66 for probing. The SiC MOSFET devices 20 were 1200 volt rated SiC devices which were probed at full breakdown voltage at test temperatures ranging from room temperature to 200° C., with no arcing observed. In fact, using these materials and thicknesses, the E-field suppression layer 36 was found to reliably contain the arcing when operating all the way up to approximately 1800 volts. Notably, the E-field suppression layer 36 may be any material that may be patterned (before or after deposition or placement onto the wafer) to expose underlying contact structures and that provides the sufficient suppression of any electric field that might be produced by the semiconductor elements of the SiC MOSFET device 20 during normally rated operating conditions (e.g., voltages and temperatures).

Figure 6A:
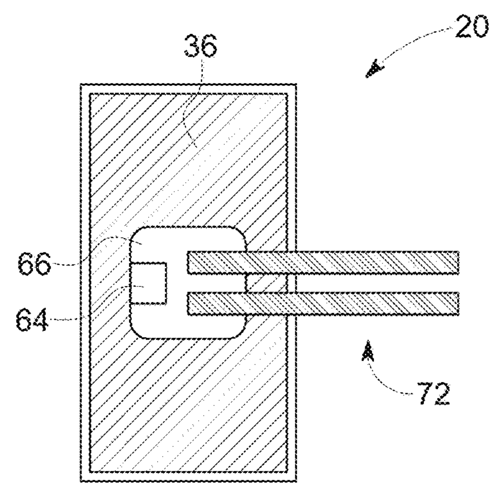
FIGS. 6A and 6B illustrate top and side views, respectively, of a portion of a SiC semiconductor device, fabricated in accordance with an embodiment of the present invention.
Figure 6B:
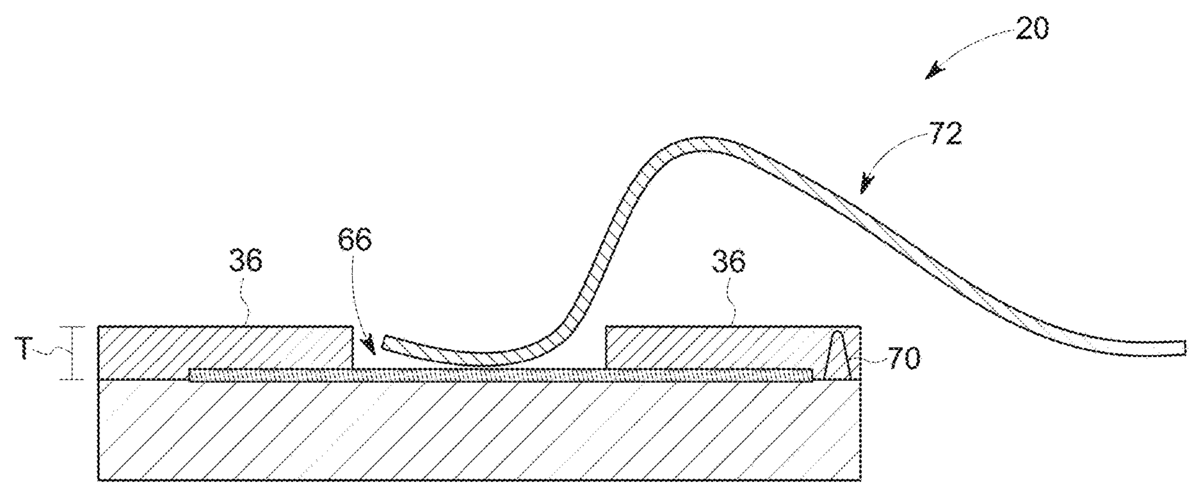

Referring now to FIGS. 6A and 6B, other features and benefits of embodiments of the present invention are described. Specifically, FIG. 6A illustrates a top view of a single SiC MOSFET 20, and FIG. 6B illustrates a side view of the SiC MOSFET device 20. As illustrated, the SiC MOSFET 20 includes an E-field suppression layer 36, patterned to expose the source metal pad 66. As previously described, the E-field suppression layer 36 has a thickness T (e.g., 80 μm-100 μm) that is sufficient to contain any electrical field 70 that may be produced at the termination region when the SiC MOSFET device 20 is operating at its highest voltage rating (e.g., 1700V). In addition to the previously described benefits of the thick E-field suppression layer 36, because the electric field 70 is reduced below levels of concern within the E-field suppression layer 36, any particles, debris or air bubbles that may be present on the top surface of the E-field suppression layer 36 will not impact operation of the device. Thus, when the SiC MOSFET device 20 is later packaged, thereby eliminating the ability to visually inspect the surface of the device 20 for such debris, the detrimental impact of any particles, debris or air bubbles (in the packaging material) will be mitigated, as any particles will not react with the residual electric fields due to the reduction of the electric field 70, within the E-field suppression layer 36. Also, illustrated in FIGS. 6A and 6B are bonding elements 72 which are electrically coupled to the source metal pad 66 to provide electrical connection to the SiC MOSFET device 20. In one embodiment, the bonding elements 72 are aluminum wedge bond elements that may electrically couple the SiC MOSFET device 20 to external elements, devices or systems. As will be appreciated, other types of bonding elements (e.g., wire bonds, straps, etc.) and other conductive metals (e.g., copper, gold, etc.) may be used in certain embodiments.

Figure 7A:
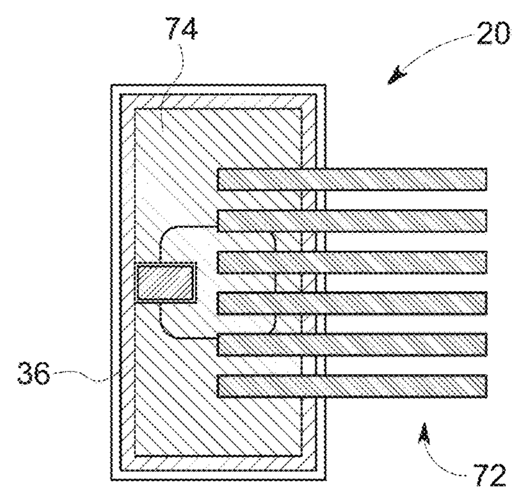
FIGS. 7A and 7B illustrate top and side views, respectively, of a portion of a SiC semiconductor device, fabricated in accordance with another embodiment of the present invention.
Figure 7B:
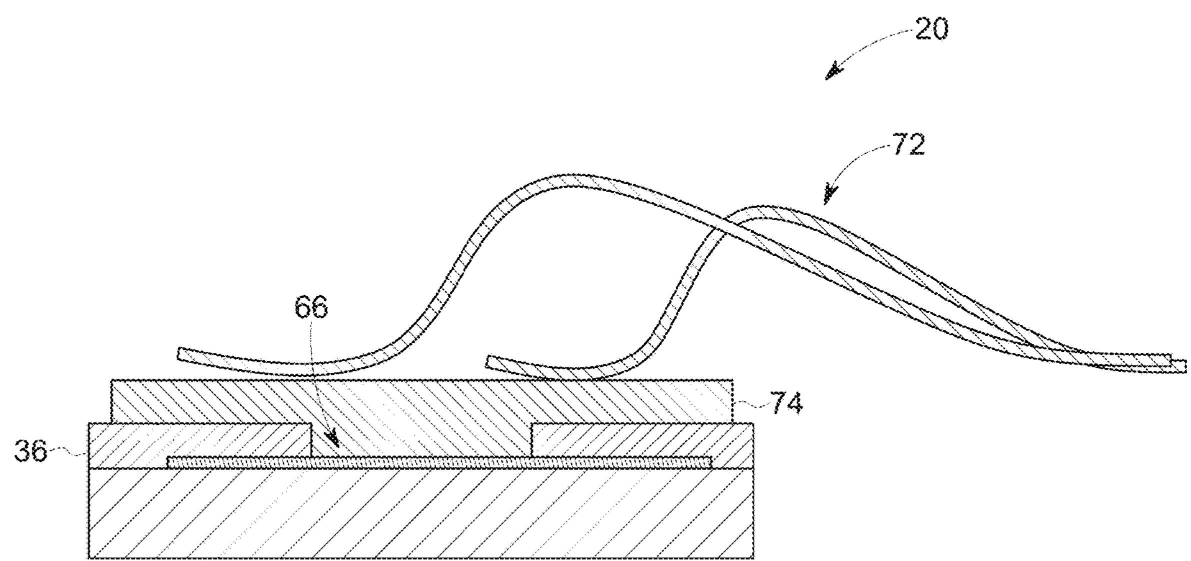

FIGS. 7A and 7B illustrate top and side views, respectively, of an alternative embodiment of the SiC MOSFET device 20, having an improved bonding structure, utilizing the E-field suppression layer 36. In order to increase the number of bonding elements 72 and provide better current density for the SiC MOSFET device 20, an additional layer of metallization 74 is provided over the entire SiC MOSFET device 20. Advantageously, in addition to the benefits described above, the E-field suppression layer 36 may also provide a dielectric layer as an insulative barrier between the metallization 74 and the underlying active areas of the SiC MOSFET device 20. In this embodiment, the E-field suppression layer 36 and the metallization 74 combine to provide a power overlay (POL) structure. POL structures may be advantageously employed for bonding to SiC MOSFET devices 20. As the current density of the device increases, the device's total current may be limited by the ampacity of the wire connection to the source bond (e.g. limited cross sectional area). This is especially true for smaller die with relatively large areas of the die used for termination. As provided herein, the E-field suppression layer 36 formed over the termination region may be utilized as a POL dielectric layer in conjunction with a POL metallization layer 74 to form a POL structure that redistributes the bonding area to be larger than the original pad size (i.e., source metal pad 66), while maintaining electrical isolation from the underlying active regions of the SiC MOSFET device 20. The disclosed POL structure, incorporating the E-field suppression layer 36 disposed over the termination region, can also provide a re-metallization to be compatible with various metal types and various bonding techniques. For instance, the metallization 74 may be copper (Cu) with Nickel-Gold (NiAu) for better bonding. The number of bonding elements 72 may be increased because the size of the metallization 74 is larger than the underlying source metal pad 66. In one embodiment, the bonding elements 72 are aluminum wedge bond elements. In another embodiment, the bonding elements 72 are copper wedge bond elements. As will be appreciated, other types of bonding elements (e.g., wire bonds, straps, etc.) and other conductive metals may be used in certain embodiments.

Figure 8A:
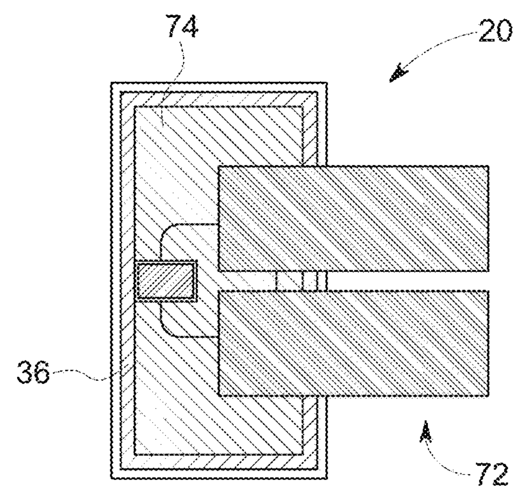
FIGS. 8A and 8B illustrate top and side views, respectively, of a portion of a SiC semiconductor device, fabricated in accordance with another embodiment of the present invention.
Figure 8B:
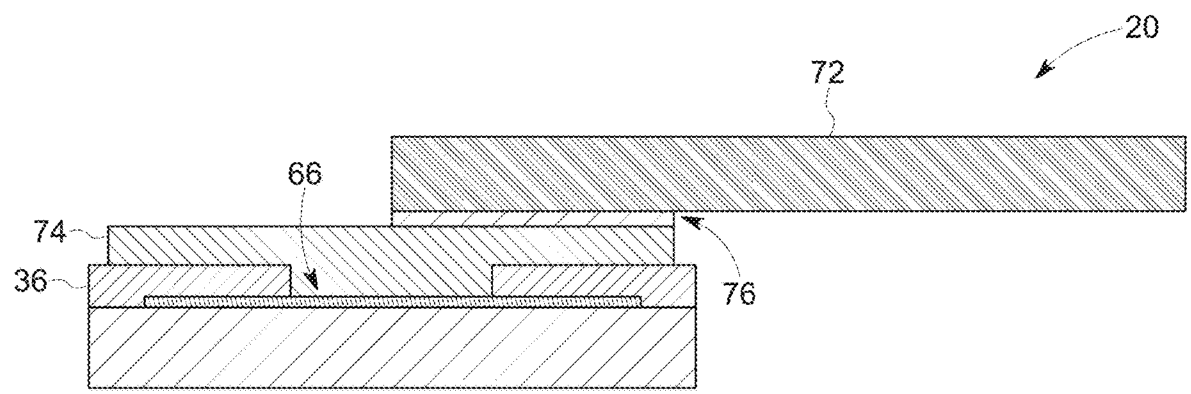

FIGS. 8A and 8B illustrate top and side views, respectively, of an alternative embodiment of the SiC MOSFET device 20, having an improved bonding structure, utilizing the E-field suppression layer 36 and a bonding element 72 that may lower the on-resistance of the package during operation. As with the embodiment illustrated in FIGS. 7A and 7B, the presently illustrated embodiment includes a POL structure for redistribution of the bonding region over a larger area. The POL structure includes the E-field suppression layer 36 (POL dielectric) and the metallization layer 74. The metallization 74 may be copper (Cu) with Nickel-Gold (NiAu) for better bonding. In the illustrated embodiment, the bonding element 72 may be a copper strap or copper clip bonding element that may electrically and physically coupled to the underlying metallization 74 using solder 76, for instance. As will be appreciated, other conductive adhesives may be used in place of the solder 76. Advantageously, the usage of copper clip bonding may lower the on-resistance of the package during operation.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The invention claimed is:

1. A method of fabricating a semiconductor device, comprising:

providing a wafer comprising a plurality of semiconductor devices;

disposing an electric field (E-field) suppression layer on the wafer, wherein the E-field suppression layer comprises openings that are aligned with conductive pads of each of the plurality of semiconductor devices; and functionally testing each of the plurality of semiconductor devices on the wafer over a full range of operating parameters.

2. The method of claim 1, wherein functionally testing comprises functionally testing each of the plurality of semiconductor devices on the wafer when each of the semiconductor devices is operating at or below a maximum voltage.

3. The method of claim 2, wherein the maximum voltage is in the range of 900 volts to 10 KV.

4. The method of claim 1, wherein functionally testing comprises functionally testing each of the plurality of semiconductor devices on the wafer when each of the semiconductor devices is operating at or below a maximum temperature rating.

5. The method of claim 4, wherein the maximum temperature rating is in the range of 175° C.-200° C.

6. The method of claim 1, wherein functionally testing each of the plurality of semiconductor devices on the wafer comprises identifying known good die of the wafer.

7. The method of claim 1, comprising singulating the plurality of semiconductor devices of the wafer.

8. The method of claim 7, comprising packaging the singulated semiconductor devices.

9. A method of fabricating a semiconductor device, comprising:

providing a wafer comprising an electric field (E-field) suppression layer formed over a plurality of semiconductor devices, wherein the E-field suppression layer comprises openings that are aligned with conductive pads of each of the plurality of semiconductor devices;

functionally testing each of the plurality of semiconductor devices on the wafer, via the conductive pads, over a full range of operating parameters to identify known good die;

singulating each of the plurality of semiconductor devices; and packaging the known good die.

10. The method of claim 9, wherein the E-field suppression layer comprises a dielectric dry film.

11. The method of claim 9, wherein providing the wafer comprises:

fabricating the plurality of semiconductor devices on a substrate;

disposing the E-field suppression layer onto the plurality of semiconductor devices; and patterning the E-field suppression layer to form the openings.

12. The method of claim 11, wherein the method is performed in the recited order.

13. The method of claim 9, wherein functionally testing comprises functionally testing each of the plurality of semiconductor devices over a full range voltages and temperatures at which each of the plurality of semiconductor devices is rated to operate.

* * * * *